US006955382B2

(12) United States Patent
Eggum

(10) Patent No.: US 6,955,382 B2
(45) Date of Patent: Oct. 18, 2005

(54) WAFER CARRIER DOOR AND LATCHING MECHANISM WITH C-SHAPED CAM FOLLOWER

(75) Inventor: Shawn D. Eggum, Lonsdale, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/317,023

(22) Filed: Dec. 11, 2002

(65) Prior Publication Data

US 2003/0137151 A1 Jul. 24, 2003

Related U.S. Application Data

(60) Provisional application No. 60/349,068, filed on Jan. 15, 2002.

(51) Int. Cl.[7] .............................................. E05C 1/06
(52) U.S. Cl. ......................... 292/116; 292/34; 292/36; 292/37; 292/46; 292/98; 292/140; 292/159; 292/256.5; 292/257; 292/DIG. 11; 292/DIG. 12; 206/710; 206/711; 206/454; 220/323
(58) Field of Search ..................... 206/710, 711, 454; 292/34, 35, 36, 37, 41, 46, 47, 56, 159, 98, 292/140, 256.5, 257, DIG. 11, DIG. 12; 220/323

(56) References Cited

U.S. PATENT DOCUMENTS

| 368,784 | A | * | 8/1887 | Rippe | 292/33 |
| 1,092,289 | A | * | 4/1914 | Reese | 292/5 |
| 1,179,099 | A | * | 4/1916 | Hayashi | 292/39 |
| 1,269,572 | A | * | 6/1918 | Allenbaugh | 292/37 |
| 1,303,087 | A | * | 5/1919 | Lutz | 292/5 |
| 1,375,134 | A | * | 4/1921 | Davis | 292/5 |
| 1,375,645 | A | * | 4/1921 | Unckrich | 292/5 |
| 1,909,697 | A | * | 5/1933 | MacBeth et al. | 292/36 |
| 1,929,341 | A | * | 10/1933 | Wegner | 292/5 |
| 2,315,239 | A | * | 3/1943 | Young | 292/47 |
| 2,473,065 | A | * | 6/1949 | Miller | 292/37 |
| 2,486,460 | A | * | 11/1949 | Bonenberger | 292/34 |
| 3,953,061 | A | * | 4/1976 | Hansen et al. | 292/5 |
| 4,114,933 | A | * | 9/1978 | Jankelewitz et al. | 292/37 |
| 4,142,747 | A | * | 3/1979 | Beck et al. | 292/37 |
| 4,534,586 | A | * | 8/1985 | Smith | 292/228 |
| 4,893,849 | A | * | 1/1990 | Schlack | 292/7 |
| 4,995,430 | A | * | 2/1991 | Bonora et al. | 141/98 |

(Continued)

FOREIGN PATENT DOCUMENTS

GB 2118611 A * 11/1983 ............. E05C 9/04

OTHER PUBLICATIONS

Copy of International Search Report (PCT/US03/01127) dated Apr. 30, 2003 from corresponding PCT application.

Primary Examiner—Daniel P. Stodola
Assistant Examiner—Carlos Lugo
(74) Attorney, Agent, or Firm—Patterson, Thuente, Skaar & Christensen, P.A.

(57) ABSTRACT

A wafer container, and methods of constructing a wafer container. The wafer container has an enclosure portion with at least a top, a bottom, a pair of opposing sides, a back, an open front, and a door to close the open front. The door includes a door chassis with at least a first latching mechanism. The latching mechanism has a rotatable cam member and at least one latching arm. The latching arm has a bifurcate cam follower portion that engages with the periphery of the cam member.

14 Claims, 4 Drawing Sheets

U.S. PATENT DOCUMENTS

| | | | |
|---|---|---|---|
| 5,570,987 A * | 11/1996 | McKenna | 414/416.01 |
| 5,632,166 A * | 5/1997 | Wiersma | 70/120 |
| 5,711,427 A | 1/1998 | Nyseth | |
| 5,740,845 A * | 4/1998 | Bonora et al. | 141/292 |
| 5,915,562 A * | 6/1999 | Nyseth et al. | 206/710 |
| 5,931,512 A | 8/1999 | Fan et al. | |
| 5,957,292 A * | 9/1999 | Mikkelsen et al. | 206/710 |
| 6,000,732 A | 12/1999 | Scheler et al. | |
| 6,098,809 A * | 8/2000 | Okada et al. | 206/711 |
| 6,105,782 A * | 8/2000 | Fujimori et al. | 206/710 |
| 6,186,331 B1 | 2/2001 | Kinpara et al. | |
| 6,216,873 B1 * | 4/2001 | Fosnight et al. | 206/710 |
| 6,281,516 B1 * | 8/2001 | Bacchi et al. | 250/559.29 |
| 6,350,418 B1 * | 2/2002 | Venderpool et al. | 422/297 |
| 6,398,475 B1 * | 6/2002 | Ishikawa | 414/217 |
| 6,430,877 B1 * | 8/2002 | Rosenquist et al. | 49/395 |
| 6,450,555 B1 * | 9/2002 | Collister et al. | 292/210 |
| 6,457,598 B1 * | 10/2002 | Hsieh et al. | 220/323 |
| 6,467,626 B1 * | 10/2002 | Misaka | 206/710 |
| 6,536,592 B1 * | 3/2003 | Chang et al. | 206/459.1 |
| 6,623,051 B2 * | 9/2003 | Bonora | 292/330 |

* cited by examiner

WAFER CARRIER DOOR AND LATCHING MECHANISM WITH C-SHAPED CAM FOLLOWER

This application claims the benefit under 35 U.S.C 119(e) of U.S. Provisional Application No. 60/349,068, filed Jan. 15, 2002.

FIELD OF THE INVENTION

The present invention generally pertains to a wafer carrier designed for supporting, constraining, storing and precisely positioning semi-conductor wafer disks for use in the production of integrated circuits. More specifically, the present invention pertains to latching mechanisms for wafer containers.

BACKGROUND OF THE INVENTION

Processing of semi-conductor wafers into finished electronic components typically requires many processing steps where the wafers must be handled and processed. The wafers are very valuable, and are extremely delicate and easily damaged by physical and electrical shocks. In addition, successful processing requires the utmost in cleanliness, free of particulates and other contaminants. As a result, specialized containers or carriers have been developed for use during processing, handling and transport of wafers. These containers protect the wafers from physical and electrical hazards, and are sealable to protect the wafers from contaminants. An important characteristic of these containers is that they must be cleanable between uses to ensure that cleanliness is maintained as much as possible. Accordingly, ease of assembly and disassembly of the carrier is a desirable feature.

Various configurations of door enclosures and latching mechanisms for sealable wafer carriers are known in the art. Latching mechanisms known in the art often use rotatable cam members. These cam members have typically been formed of planar plastic plates with elongate recesses defining cam surfaces. In early designs, these cam surfaces only provided motion of the cam follower in one direction, typically a single back and forth radial direction that translated to an extension and retraction of the latching portions. Later, a latch motion in the axial direction of the cam member was introduced in order to provide a means of securing the wafer carrier door more tightly for sealing reasons. These axial translation means typically added a substantial number of component parts to the latch assembly. Such additional component parts increase manufacturing costs, increase the complexity of the latching mechanism, increase the difficulty in assembly and disassembly, and increase the number of rubbing and scraping surfaces which generate more particulates.

A rotatable cam actuated latching mechanism having an improved cam follower allowing the needed axial movement of a latching arm in addition to simple radial movement was disclosed in U.S. Pat. No. 5,957,292 incorporated fully herein by reference. That invention allowed for a secure door latching mechanism having fewer component parts and with less rubbing and scraping contact, in part due to an s-shaped cam follower that engaged and captured the cam member. The s-shaped cam follower, however, still required cam surfaces defined by an elongated slot in the cam. Such a slotted structure is more difficult to produce than a solid member. In addition, more manipulative steps are required to assemble the cam follower with the cam member.

Further improvement to the simplicity and ease of assembly for a door latching mechanism is needed and requires that a cam follower engage and capture the edge of a rotary cam member in some fashion.

SUMMARY OF THE INVENTION

The present invention fulfills the need for an edge-capturing cam follower for use with a rotary cam member. In the invention, a wafer container having an enclosure portion with at least a top, a bottom, a pair of opposing sides, a back, an open front, and a door to close the open front is provided. The door includes a door chassis with at least a first latching mechanism. The latching mechanism has a rotatable cam member and at least one latching arm. The latching arm has a bifurcate cam follower portion that engages with the periphery of the cam member. The invention provides a simpler latching mechanism while maintaining secure engagement of the cam follower with the cam.

An object and advantage of the invention is that the cam follower is securely engaged and captured with the cam member and follows axial as well as radial cam motion.

Another object and advantage of the invention is that the cam follower is engaged with the cam member at the edge of the cam member rather than in an elongate slot, simplifying manufacturing of the cam member and assembly of the components.

Another object and advantage of the invention is a latching mechanism for a wafer carrier door that is more easily assembled and disassembled for cleaning.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

The accompanying Figures depict embodiments of the wafer container of the present invention, and features and components thereof. Any references to front and back, right and left, top and bottom, upper and lower, and horizontal and vertical are intended for convenience of description, not to limit the present invention or its components to any one positional or spacial orientation. Any dimensions specified in the attached Figures and this specification may vary with a potential design and the intended use of an embodiment of the invention without departing from the scope of the invention.

Figure 1:
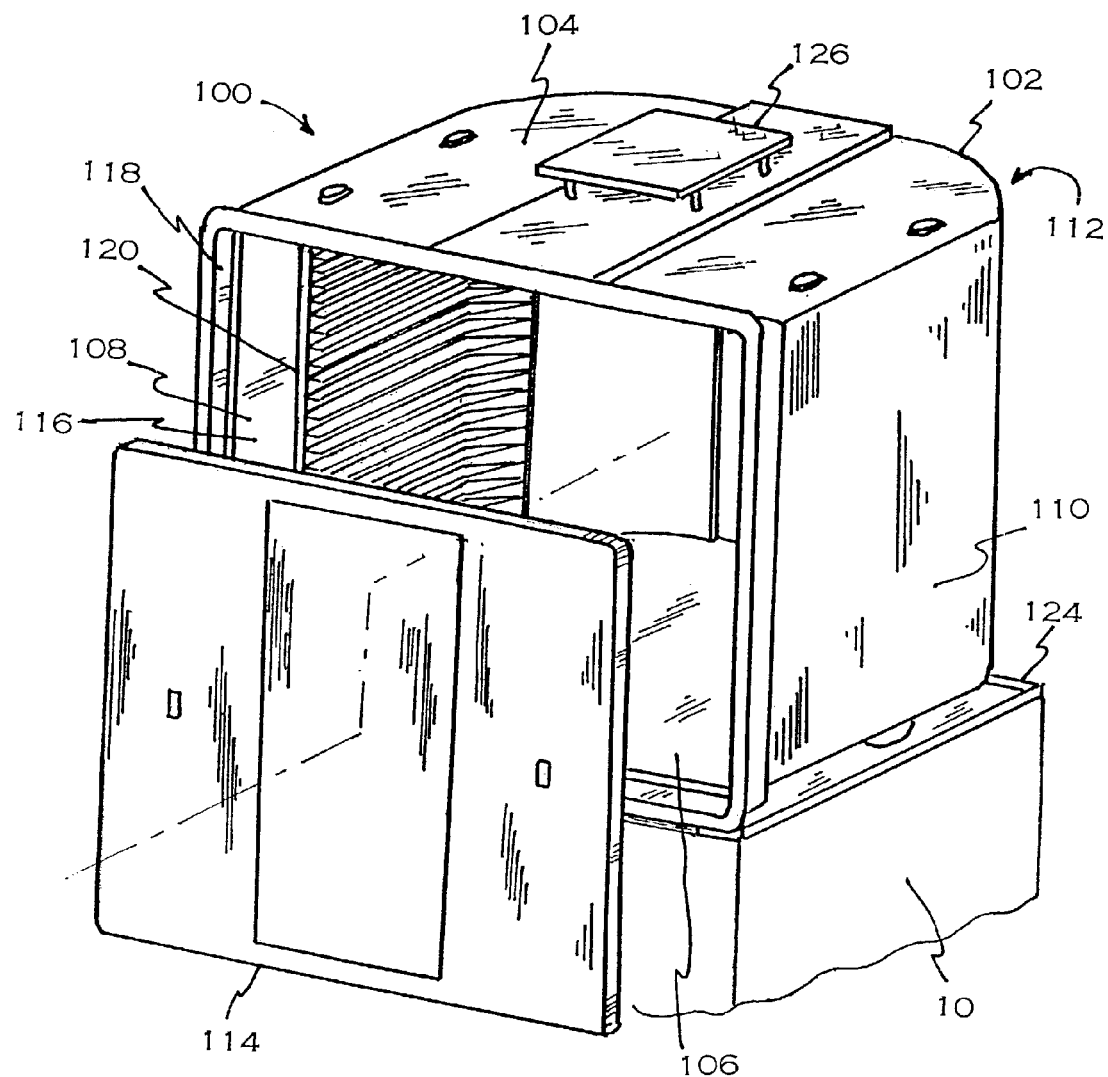
FIG. 1 is a perspective view of the wafer carrier and door of the present invention.

Referring first to FIG. 1, a wafer container 100 is seated on automatic processing equipment 10. Wafer container 100 has an enclosure portion 102, constructed of polycarbonate plastic, and having a top 104, a bottom 106, a pair of opposing sides 108 and 110, and a back 112. A door 114 completes the enclosure by enclosing the open front 116 of enclosure portion 102, fitting into door recess 118. Wafer supports 120 are provided to support semi-conductor wafers within the enclosure. Kinematic coupling 124, mounted to the exterior surface of enclosure bottom 106 is provided to facilitate automated handling of the container during use and to provide a reference datum for locating the wafers in the housing during processing. Robotic lifting flange 126 is mounted on the exterior surface of enclosure top 104 and is provided to facilitate automated handling and transport of container 100 during use.

Figure 2:
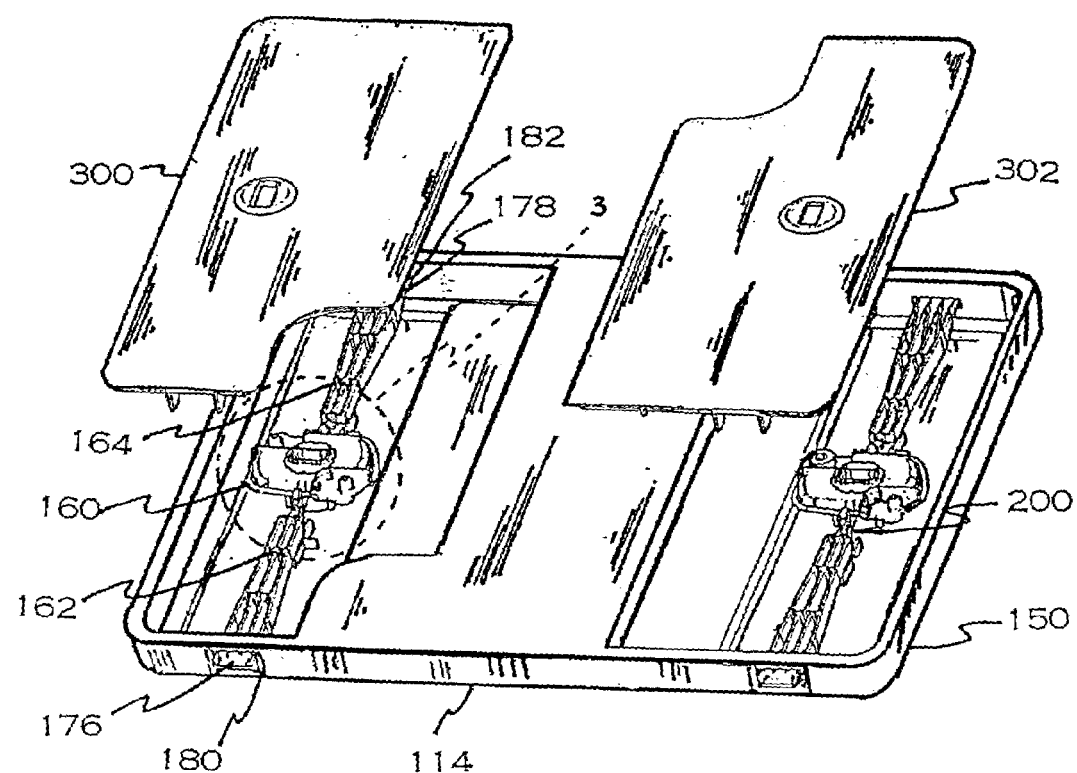
FIG. 2 is a perspective view of a wafer carrier door.

Referring to FIG. 2, the wafer carrier door 114 of the present invention is depicted. Door 114 is comprised generally of a door chassis 150 and latching mechanisms 160, 200. Mechanism covers 300, 302 are provided to protect the latching mechanisms 160, 200 from physical damage and contamination and to retain and guide the latching mechanism components.

Figure 3:
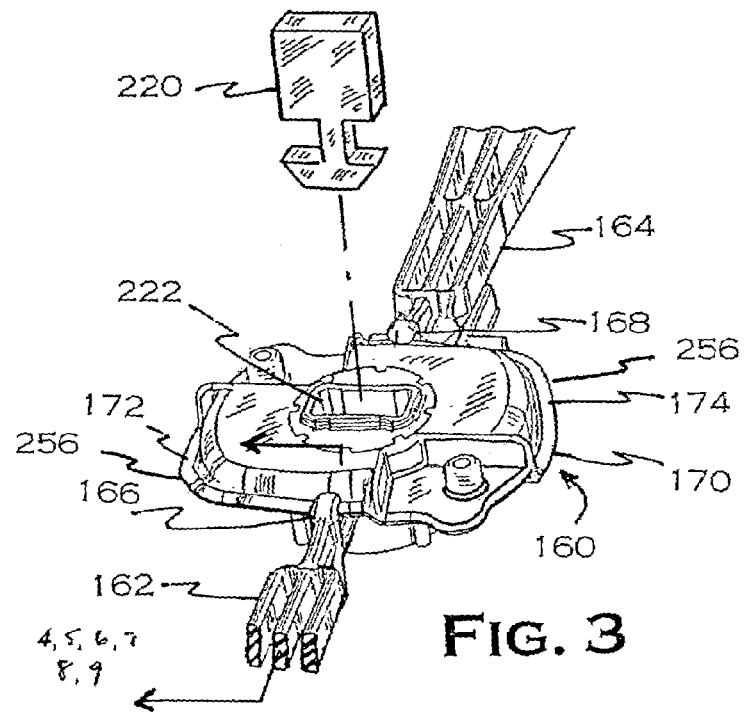
FIG. 3 is a perspective view of the door latching mechanism.

Referring now to FIGS. 1, 2 and 3, the structure and operation of latching mechanisms 160 and 200 can be understood. In FIG. 3, there is shown a partial view of latching mechanism 160. Latching arms 162 and 164 each have a cam follower portion 166 and 168 respectively, engaged with the periphery 256 of cam member 170 at cam portions 172 and 174. As depicted in FIG. 2, each of latching arms 162 and 164 has a latching portion 176 and 178 at the end opposite from cam follower portions 166 and 168. When key 220 is inserted into key slot 222 and rotated, cam follower portions 166 and 168 slide along cam portions 172 and 174. Due to the shape of cam member 170, latching arms 162 and 164 are translated radially, extending or retracting latching portions 176 and 178 through latch openings 180 and 182. In addition, cam member 170 may impart motion to latching arms 162 and 164 parallel to the axis of rotation of cam member 170 to draw door 114 more tightly into door recess 118 for sealing purposes. Latching portions 176 and 178 are received by recesses (not shown) in the wafer carrier, allowing the door to be secured in place.

Figure 4:
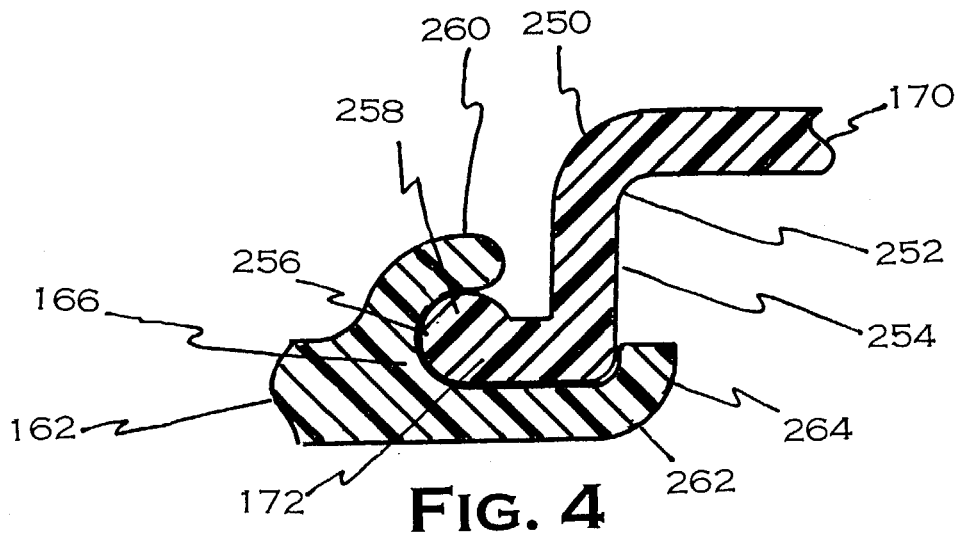
FIG. 4 is a cross-sectional view of a currently most preferred embodiment of the cam and cam follower of the present invention.

A partial cross-sectional view of cam follower portion 166 and cam portion 172 of cam member 170, in a currently most preferred embodiment of the invention is shown in FIG. 4. Cam portion 172, which is a portion of periphery 256 of cam member 170, has upper surface 250 and lower surface 252. Recessed portion 254 is formed in lower surface 252 inward of periphery 256 of cam member 170. Raised lip 258 is raised from upper surface 250 of cam member 170. Latching arm 162 has cam follower portion 166, which is bifurcated into top branch 260 and bottom branch 262. Top branch 260 extends over cam portion 172 and engages with raised lip 258, while bottom branch 262 extends under cam portion 172. Upwardly turned portion 264 of bottom branch 262 engages with recessed portion 254 of cam member 170. Cam portion 172 is thus held between the furcations of cam follower portion 166, ensuring that cam follower portion 166 follows cam motion imparted in the axial direction with respect to the axis of rotation of the cam. In addition, cam portion 172 is also held between the furcations of cam follower portion 166 and upwardly turned portion 264, ensuring cam following in the radial direction.

Figure 5:
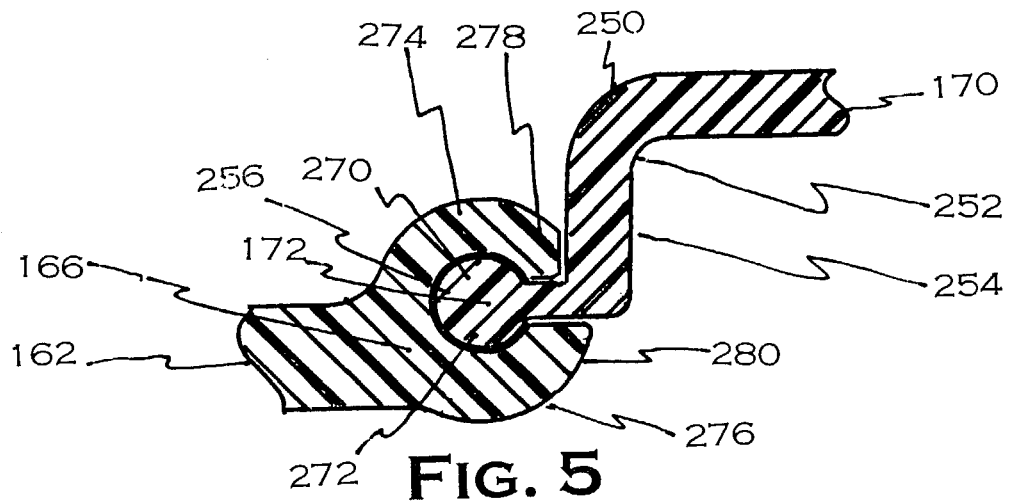
FIG. 5 is a cross-sectional view of an alternative embodiment of the cam and cam follower of the present invention.

In FIG. 5, an alternative embodiment of cam follower portion 166 and cam member 170 is depicted in cross-section. In this embodiment, top surface 250 has raised lip 270 and bottom surface 252 has an opposing raised lip 272. Cam follower portion 166 is bifurcated into top branch 274 and bottom branch 276. Cam portion 172 is held between top branch 274 and bottom branch 276, ensuring that cam follower portion 166 follows cam motion imparted in the axial direction with respect to the axis of rotation of the cam. Top branch 274 and bottom branch 276 each have inwardly turned portions 278 and 280 respectively, which engage raised lips 270 and 272 inward of periphery 256, holding cam portion 172 and ensuring that cam follower portion 166 follows radial motion imparted by cam member 170.

Figure 6:
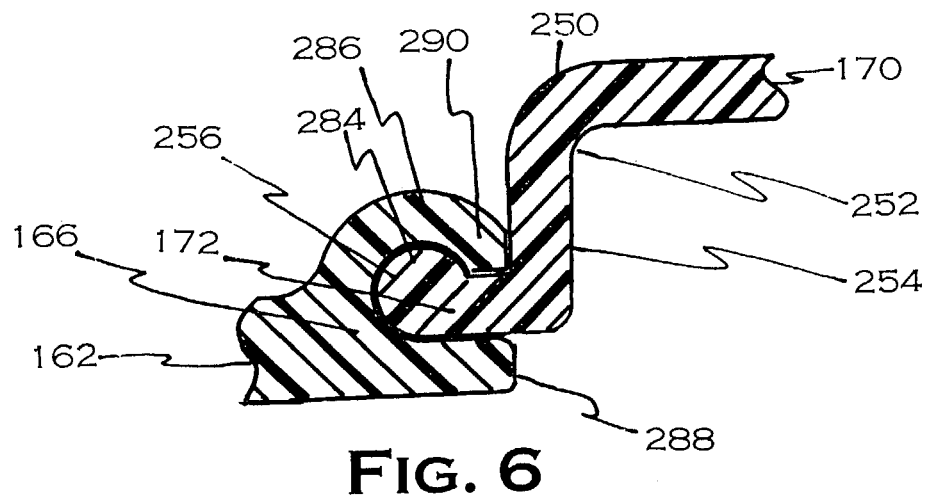
FIG. 6 is a cross-sectional view of another alternative embodiment of the cam and cam follower of the present invention.

Another embodiment of the invention is shown in FIG. 6. In this embodiment, top surface 250 has raised lip 284. Again, cam follower portion 166 is bifurcated into top branch 286 and bottom branch 288. Cam portion 172 is held between top branch 286 and bottom branch 288, ensuring that cam follower portion 166 follows cam motion imparted in the axial direction with respect to the axis of rotation of the cam. Top branch 286 has an inwardly turned portion 290 that engages raised lip 284 inward of periphery 256, holding cam portion 172 and ensuring that cam follower portion 166 follows radial motion imparted by cam member 170.

Figure 7:
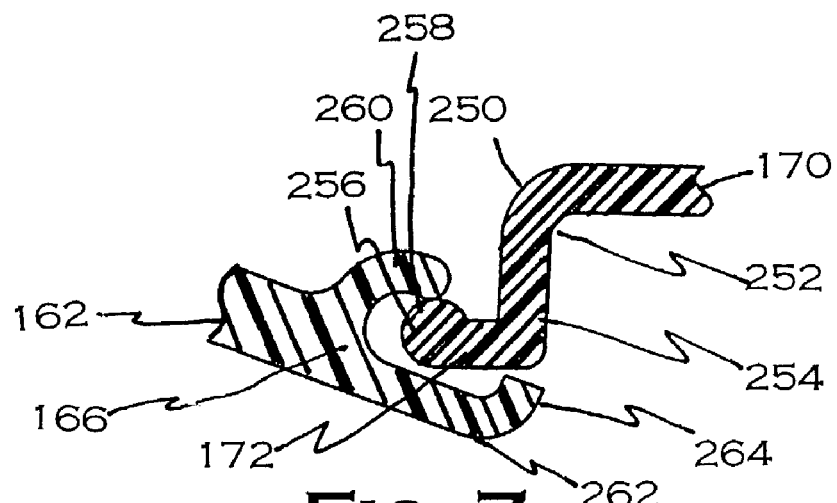
FIG. 7 is a cross-sectional view of a currently most preferred embodiment of the cam and cam follower of the present invention showing a step in assembly.
Figure 8:
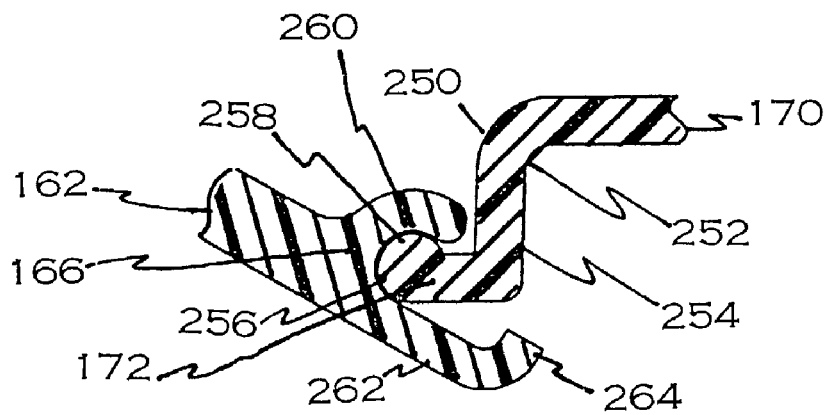
FIG. 8 is a cross-sectional view of a currently most preferred embodiment of the cam and cam follower of the present invention showing another step in assembly.
Figure 9:
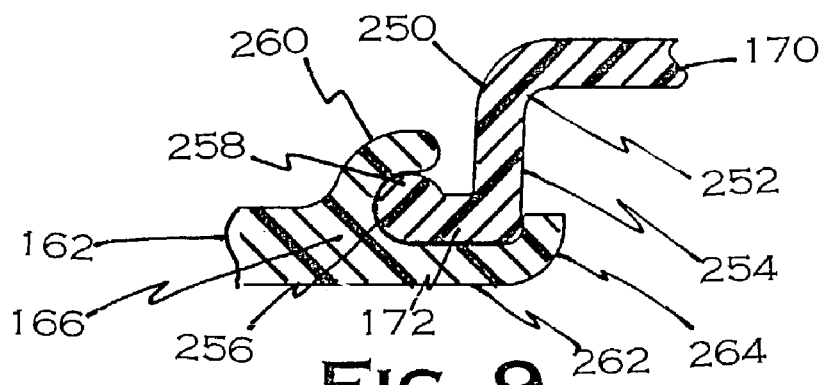
FIG. 9 is a cross-sectional view of a currently most preferred embodiment of the cam and cam follower of the present invention showing another step in assembly.

FIGS. 7, 8 and 9 illustrate a method of assembly for the embodiment of FIG. 4. Top branch 260 is first engaged with lip 258 as shown in FIG. 7. As cam follower portion 166 is advanced toward cam member 170, cam portion 172 fits into the furcation between top branch 260 and bottom branch 262, as shown in FIG. 8. As shown in FIG. 9, cam follower portion 166 is rotated downward, and upwardly turned portion 264 engages recessed portion 254.

It will of course be appreciated that, in addition to the specific orientations described above, a variety of other configurations are possible within the scope of the invention. For instance, in the embodiment depicted in FIG. 4, the structures could be reversed with raised lip 258 provided on the underside of cam member 170 and recessed portion 254 formed on the top side. In such an embodiment, cam follower portion 166 would also be reversed so that branch 262 is the top branch and branch 260 is the bottom branch.

The cam member and cam follower of the present invention can be made from any suitable material or combination of materials. Plastic material is the currently most preferred material for both. Preferably, cam member 170 and cam portion 172 are molded from hard, abrasion resistant material such as PPS, while the latching arms and cam follower are preferably molded from acetal plastic. Carbon fiber or other electrically conductive fill may be added to either to provide conductivity, and PTFE may be added to reduce friction.

Although the description above contains many specificities, these should not be construed as limiting the scope of the invention but as merely providing illustrations of some of the presently preferred embodiments of the invention.

Thus, the scope of the invention should be determined by the appended claims and their legal equivalents, rather than by the examples given.

What is claimed is:

1. A wafer container for holding semiconductor wafers, the container comprising:
   an enclosure portion having at least a top, a bottom, a pair of opposing sides, a back, and an open front;
   a pair of wafer supports in the enclosure portion, the wafer supports defining a plurality of slots, each slot adapted to receive a wafer; and
   a door to close the open front of the enclosure portion, said door comprising:
      a door chassis; and
      at least a first latching mechanism on said door chassis, said first latching mechanism including:
         a rotatable cam member having a first surface, an opposed second surface, and a periphery, the first surface having a first raised lip portion at the periphery, the second surface having a recessed portion inward of the periphery; and
         at least a first latching arm having a bifurcate cam follower portion with a pair of branches, the bifurcate cam follower portion being slidingly engaged with the periphery of the cam member at the bifurcation of the branches, a first branch of said pair of branches engaged with the first raised lip portion, and a second branch of said pair of branches engaged with the recessed portion.

2. The container of claim 1, the door further comprising a second latching arm.

3. The container of claim 1, the door further comprising a second latching mechanism.

4. A wafer container for holding semiconductor wafers, the container including an enclosure portion having at least a top, a bottom, a pair of opposing sides, a back, at least one wafer support, an open front, and a door to close the open front, said door comprising: a door chassis; and
   at least a first latching mechanism on said door chassis, said first latching mechanism including:
      a rotatable cam member having a first surface, an opposed second surface, and a periphery, the first surface having a first raised lip portion at the periphery, the second surface having a second raised lip portion at the periphery; and
      at least a first latching arm having a bifurcate cam follower portion with a pair of branches, the bifurcate cam follower portion being slidingly engaged with the periphery of the cam member at the bifurcation of the branches, a first branch of said pair of branches engaged with the first raised lip portion, and a second branch of said pair of branches engaged with the second raised lip portion.

5. The container of claim 4, the door further comprising a second latching arm.

6. The container of claim 4, the door further comprising a second latching mechanism.

7. A wafer container for holding semiconductor wafers, the container including an enclosure portion having at least a top, a bottom, a pair of opposing sides, a back, at least one wafer support, an open front, and a door to close the open front, said door comprising: a door chassis; and
   at least a first latching mechanism on said door chassis, said first latching mechanism comprising:
      a rotatable cam member having a first surface, an opposed second surface, and a periphery, the first surface having a raised lip portion at the periphery; and
      at least a first latching arm having a bifurcate cam follower portion with a pair of branches, the bifurcate cam follower portion being slidingly engaged with the periphery of the cam member at the bifurcation of the branches, a first branch of said pair of branches engaged with the raised lip portion, and a second branch of said pair of branches slidingly engaged with the second surface.

8. The container of claim 7, the door further comprising a second latching arm.

9. The container of claim 7, the door further comprising a second latching mechanism.

10. A wafer container for holding semiconductor wafers, the container comprising:
    an enclosure portion having at least a top, a bottom, a pair of opposing sides, a back, an open front, a pair of wafer supports in the enclosure portion, and a door to close the open front, said door comprising:
    a door chassis; and
    at least a first latching mechanism on said door chassis, said first latching mechanism comprising:
       a rotatable cam member having a periphery and a raised lip portion at the periphery; and
       at least a first latching arm, said first latching arm having a bifurcate cam follower portion with a pair of spaced apart branches adapted to be continually engaged around at least a portion of the periphery of said cam member, at least one of the branches engaged around the raised lip portion, the bifurcate cam follower portion being slidingly engaged with the periphery of the cam member at the bifurcation of the branches.

11. The container of claim 10, wherein said rotatable cam member has a recessed portion inward of said periphery, and wherein said bifurcate cam follower portion has a first branch adapted to be engaged with the raised lip portion and a second branch adapted to be engaged with the recessed portion.

12. The container of 10, wherein said rotatable cam member has a pair of raised lip portion at said periphery, wherein each branch of said bifurcate cam follower portion is adapted to be engaged with a separate one of said pair of opposing raised lip portions.

13. The container of claim 10, the door further comprising a second latching arm.

14. The container of claim 10, the door further comprising a second latching mechanisms.

* * * * *